United States Patent
Kaise et al.

(10) Patent No.: US 10,010,913 B2
(45) Date of Patent: Jul. 3, 2018

(54) PURGING APPARATUS AND PURGING METHOD FOR SUBSTRATE STORAGE CONTAINER

(71) Applicant: TOKYO ELECTRON LIMITED, Tokyo (JP)

(72) Inventors: Seiichi Kaise, Miyagi (JP); Shigeki Amemiya, Miyagi (JP); Genichi Nanasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 818 days.

(21) Appl. No.: 14/370,306

(22) PCT Filed: Jan. 30, 2013

(86) PCT No.: PCT/JP2013/051993
§ 371 (c)(1),
(2) Date: Jul. 2, 2014

(87) PCT Pub. No.: WO2013/115222
PCT Pub. Date: Aug. 8, 2013

(65) Prior Publication Data
US 2015/0040950 A1    Feb. 12, 2015

Related U.S. Application Data

(60) Provisional application No. 61/597,262, filed on Feb. 10, 2012.

(30) Foreign Application Priority Data

Feb. 3, 2012    (JP) .................................. 2012-022157

(51) Int. Cl.
*B65G 1/12*    (2006.01)
*B08B 5/02*    (2006.01)
(Continued)

(52) U.S. Cl.
CPC ........ *B08B 9/093* (2013.01); *H01L 21/67034* (2013.01); *H01L 21/67389* (2013.01)

(58) Field of Classification Search
CPC ......... H01L 21/67772; H01L 21/67775; H01L 21/67017; H01L 21/67373;
(Continued)

(56) References Cited

U.S. PATENT DOCUMENTS 4,099,296 A *   7/1978   Gustavsson .............. D04H 1/72
                                                                 156/62.2
6,867,153 B2 *  3/2005   Tokunaga ......... H01L 21/67017
                                                                 141/63

(Continued)

FOREIGN PATENT DOCUMENTS

CN          1194454 A         9/1998
JP       2004-260172 A        9/2004
(Continued)

OTHER PUBLICATIONS

International Search Report dated May 7, 2013 in PCT/JP2013/051993.

*Primary Examiner* — Douglas Lee
(74) *Attorney, Agent, or Firm* — Rothwell, Figg, Ernst & Manbeck, P.C.

(57) ABSTRACT

Provided is a purging apparatus including an upper nozzle provided above an opening of a substrate storage container and configured to supply a dry gas obliquely downwardly to a side opposite to the opening of the substrate storage container and over the entire surface of the width of the opening of the substrate storage container; and a plurality of side nozzles provided at both left and right sides of the opening of the substrate storage container, respectively, and each configured to supply the dry gas towards the inside of the substrate storage container from an outside of the opening of the substrate storage container. Each of the side
(Continued)

nozzles is longer than a height of the opening of the substrate storage container and is provided with a plurality of supply holes formed thereon at predetermined intervals in a vertical direction.

9 Claims, 5 Drawing Sheets

(51) Int. Cl.
  *B08B 9/093* (2006.01)
  *H01L 21/67* (2006.01)
  *H01L 21/673* (2006.01)
(58) Field of Classification Search
  CPC ......... H01L 21/67376; H01L 21/67379; H01L 21/67393; H01L 21/67766; H01L 21/67778; H01L 21/6719; H01L 21/67196; H01L 21/67201; H01L 21/67; H01L 21/67034; H01L 21/67389; B08B 9/093
  See application file for complete search history.

(56) References Cited

U.S. PATENT DOCUMENTS

| | | | | |
|---|---|---|---|---|
| 7,156,927 B2* | 1/2007 | Christenson | ............ | B08B 3/102 134/2 |
| 7,789,609 B2* | 9/2010 | Okabe | ............... | H01L 21/67772 141/51 |
| 2009/0169342 A1* | 7/2009 | Yoshimura | ........ | H01L 21/67772 414/217 |
| 2010/0184296 A1 | 7/2010 | Nambu et al. | | |

FOREIGN PATENT DOCUMENTS

| | | |
|---|---|---|
| JP | 2006-128153 A | 5/2006 |
| JP | 2006-351864 A | 12/2006 |
| JP | 2006-351868 A | 12/2006 |
| JP | 2007-180516 A | 7/2007 |
| JP | 2007-180517 A | 7/2007 |
| JP | 2009-38073 A | 2/2009 |
| JP | 2009-38074 A | 2/2009 |
| JP | 2009-212282 A | 9/2009 |
| JP | 2009-290102 A | 12/2009 |
| WO | 2005/124853 A1 | 12/2005 |

* cited by examiner

PURGING APPARATUS AND PURGING METHOD FOR SUBSTRATE STORAGE CONTAINER

CROSS REFERENCE TO RELATED APPLICATION

This application is a 35 U.S.C. 371 National Phase Entry Application from PCT/JP2013/051993, filed Jan. 30, 2013, which claims the benefit of U.S. Provisional Application No. 61/597,262, filed Feb. 10, 2012 and Japanese Patent Application No. 2012-022157, filed Feb. 3, 2012, the disclosures of which are incorporated herein in their entirety by reference.

TECHNICAL FIELD

The present disclosure relates to a purging apparatus and a purging method for a substrate storage container which stores substrates such as semiconductor wafers.

BACKGROUND

Conventionally, a manufacturing process of semiconductor devices has been performed in a so-called clean room where a degree of cleanliness is maintained at a high level. However, as semiconductor wafers (hereinafter, referred to as "wafers") and various processing apparatuses processing the wafers have become larger, the operating cost of the clean room has been increased. Thus, a technique of maintaining the degree of cleanliness inside a processing apparatus and inside a substrate storage container which is called a front-opening unified pod (FOUP) used in delivery of wafers between processing apparatuses at a high level has been recently adopted.

The above-mentioned substrate storage container is configured to store a plurality of wafers in multi-tiers in parallel to each other, and carry the wafers into/out of an opening formed on a surface of the substrate storage container. Nitrogen gas having a high degree of cleanliness is enclosed in the substrate storage container to prevent entrance of contaminants such as particles into the substrate storage container.

However, in addition to unprocessed wafers, wafers which have been processed in a processing apparatus are also stored in the substrate storage container. Therefore, particles adhered to the wafers in the processing apparatus may be brought into the substrate storage container. Then, other wafers may be contaminated by the particles, and thus, the product yield may be decreased.

As a method for removing particles adhered to wafers, for example, Patent Document 1 suggests a technique of injecting a purge gas having a high degree of cleanliness onto each surface of wafers stored in multi-tiers in a substrate storage container.

PRIOR ART DOCUMENT

Patent Document

Patent Document 1: Japanese Patent Laid-Open Publication No. 2006-128153

DISCLOSURE OF THE INVENTION

Problems to be Solved

However, although the technique disclosed in Patent Document 1 was used, particles are still adhered to wafers in some cases. The present inventors have intensively studied in this regard, and as a result, it is confirmed that the particles adhered to the wafers may be removed by injecting a purge gas to the wafers.

Therefore, as a result of further study on an adherence source of the particles, it is confirmed that the particles are generated after a plasma etching processing in a manufacturing process of semiconductor devices. According to the present inventors' consideration, the particles are generated due to the gas released from the wafers after a plasma etching is completed.

A putative cause of generation of the particles will be described. In a plasma etching processing, for example, hydrogen gas ($H_2$), nitrogen gas ($N_2$), and $C_xF_y$ gas are made to plasma by a high frequency power, but $NH_4F$ is produced as a by-product due to the reaction in the plasma. Then, the $NH_4F$ deposited on a silicon wafer reacts with the atmosphere in the substrate storage container to produce $(NH_4)_2SiF_6$. And, the $(NH_4)_2SiF_6$ further reacts with the moisture in the atmosphere in the substrate storage container to produce $SiO_2$, which is thought to be adhered to wafers in the substrate storage container as particles.

In addition to $SiO_2$, hydrofluoric acid (HF) is also produced by the reaction of $(NH_4)_2SiF_6$ with moisture. As a result, a problem that the sides of trenches formed on a wafer by plasma etching are etched (unnecessary etching), is confirmed.

Accordingly, in order to suppress the gas released from the wafers after plasma etching from reacting with moisture, it is desired to maintain the humidity in the substrate storage container at a low level.

The present disclosure has been made in consideration of such a problem and an object of the present disclosure is to maintain the inside of the substrate storage container at a low humidity.

Means to Solve the Problems

In order to achieve the object, the present disclosure provides a purging apparatus that purges the inside of a substrate storage container storing a plurality of substrates processed in a substrate processing apparatus vertically in multi-tiers from the outside of the substrate storage container. The purging apparatus includes: an upper nozzle provided above an opening of the substrate storage container and configured to supply a dry gas obliquely downwardly to a side opposite to the substrate storage container and over the entire surface of the width of the opening; and a plurality of side nozzles provided at both left and right sides of the opening of the substrate storage container, respectively, and each configured to supply a dry gas towards the inside of the substrate storage container from an outside of the opening, in which the side nozzles are each longer than a height of the opening and formed with a plurality of supply holes supplying the dry gas at predetermined intervals in a vertical direction, and the respective supply holes formed on the side nozzle provided at one side of the opening of the substrate storage container and the respective supply holes formed on the side nozzle provided at the other side are disposed alternately so as not to be located at the same height.

According to the present disclosure, by supplying the dry gas obliquely downwardly to a side opposite to the substrate storage container and over the entire surface of the width of the opening, a so-called air curtain may be formed on the front surface of the opening of the substrate storage container. Therefore, an external atmosphere may be suppressed from flowing into the substrate storage container from the opening of the substrate storage container. Further, since the supply holes of the side nozzles provided at both left and right sides of the opening of the substrate storage container, respectively, is formed alternately so as not to be located at the same height, the dry gas supplied from both left and right side nozzles does not stay while interfering with each other. Therefore, the dry gas may be spread evenly everywhere inside the substrate storage container, and thus, the inside of the substrate storage container may be maintained in a dry state. As a result, even though particles or gas which may cause unnecessary etching are released from wafers after plasma etching is completed, $SiO_2$ or hydrofluoric acid is not produced due to the reaction with moisture in the substrate storage container. Therefore, the substrates in the substrate storage container may be maintained in a good condition.

Each of the supply holes of the side nozzles may be formed at each of the heights located between the substrates stored in the substrate storage container.

At least two of the supply holes may be formed sequentially adjacent to each other in the vertical direction of the side nozzles.

The plurality of side nozzles may be formed with defect portions in which the supply holes are not formed such that the dry gas is not supplied between the substrates stored in the substrate storage container from any of the plurality of side nozzles.

The plurality of side nozzles may supply the dry gas along a diagonal line of the substrate storage container.

The plurality of side nozzles may supply the dry gas towards the substrate storage container in a parallel direction.

The upper nozzle may supply the dry gas obliquely downwardly at an angle of 5° to 15° with respect to the vertical direction.

According to another aspect, the present disclosure provides a purging method of purging a substrate storage container by a purging apparatus, the purging method including: placing the substrate storage container on a placing unit; starting supplying the dry gas from the upper nozzle and the side nozzles after a cover of the substrate storage container is opened; closing the cover after a processing of the substrates in the substrate storage container is terminated; and stopping supplying the dry gas after a door of the substrate storage container is closed.

Effect of the Invention

According to the present disclosure, the inside of the substrate storage container may be maintained at a low humidity.

DETAILED DESCRIPTION TO EXECUTE THE INVENTION

Figure 1:
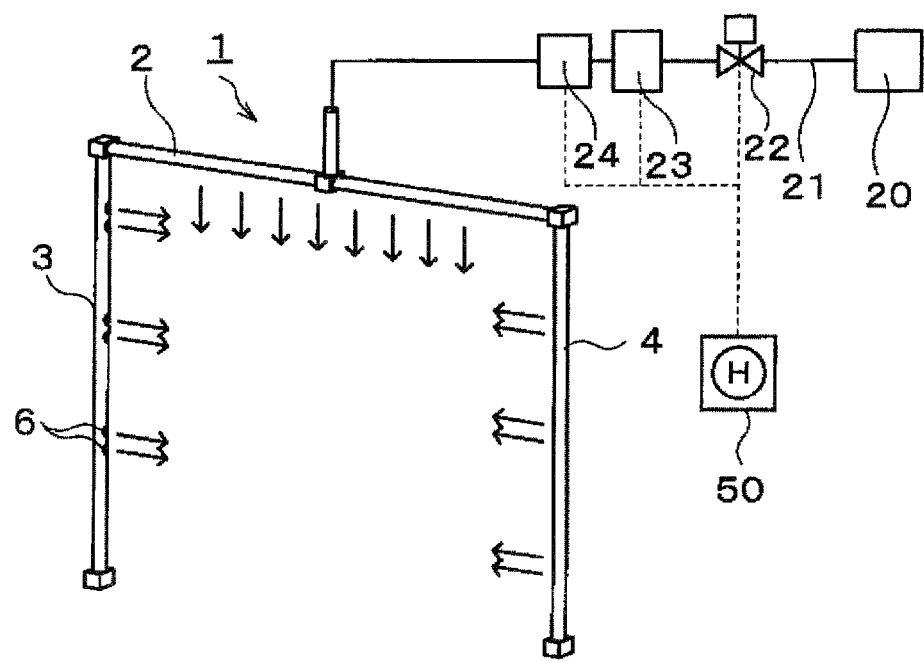
FIG. 1 is a perspective view illustrating an example of a configuration of a purging apparatus according to the present exemplary embodiment.
Figure 2:
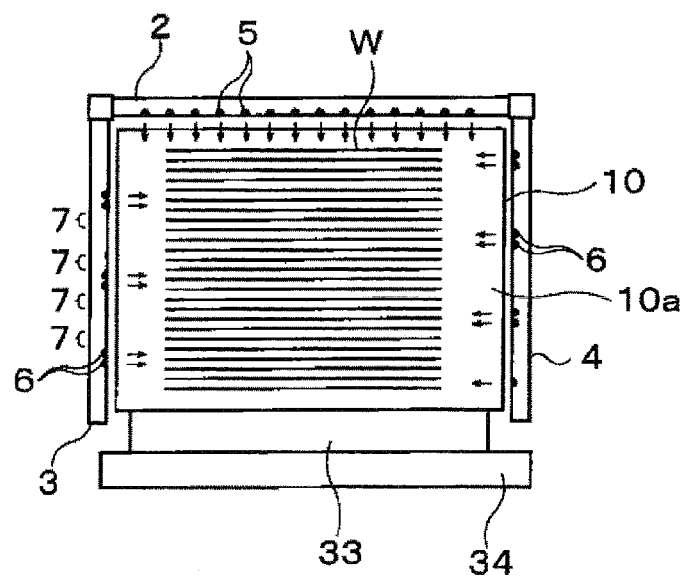
FIG. 2 is a front view illustrating a schematic configuration of the purging apparatus according to the present exemplary embodiment and the vicinity of the substrate storage container.
Figure 3:
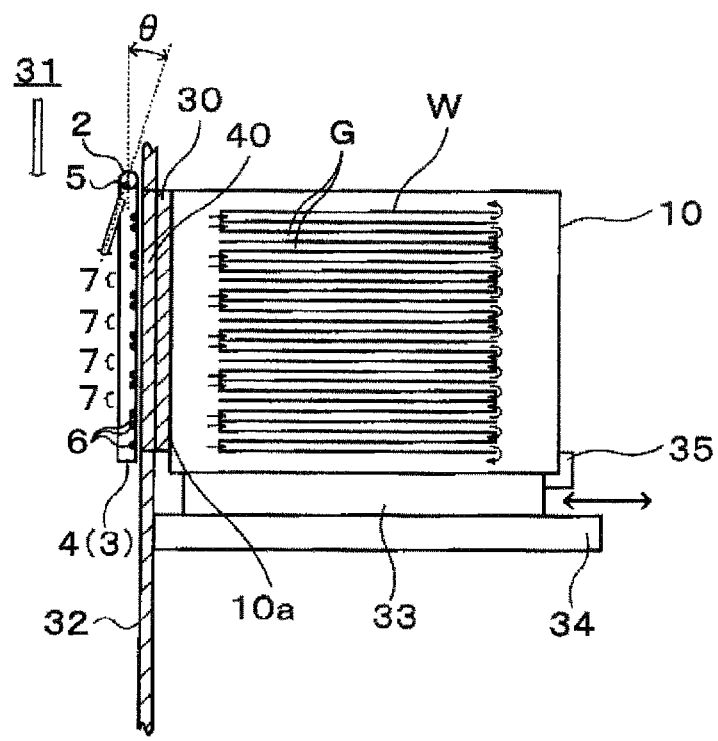
FIG. 3 is a vertical-sectional view illustrating the schematic configuration of the purging apparatus according to the present exemplary embodiment and the vicinity of the substrate storage container.
Figure 4:
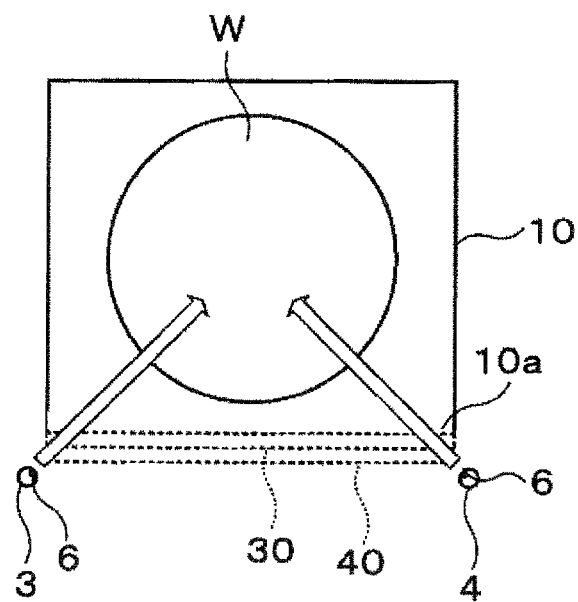
FIG. 4 is a cross-sectional view illustrating the schematic configuration of the purging apparatus according to the present exemplary embodiment and the vicinity of the substrate storage container.

Hereinafter, an exemplary embodiment of the present disclosure will be described with reference to drawings. FIG. 1 is a perspective view illustrating a schematic configuration of a purging apparatus 1 according to the present exemplary embodiment. FIGS. 2 and 3 are each a front view and a vertical-sectional view illustrating a positional relationship between the purging apparatus 1 and a substrate storage container 10. Further, FIG. 4 is a cross-sectional view illustrating a positional relationship between the purging apparatus 1 and the substrate storage container 10.

As illustrated in FIG. 1, the purging apparatus 1 is provided with an upper nozzle 2 that extends horizontally, and a plurality of side nozzles 3, 4 that communicate with the upper nozzle 2 and extend downwardly from both ends of the upper nozzle 2.

The upper nozzle 2 is disposed above an opening 10a of the substrate storage container 10 that has a box shape and stores a plurality of wafers W horizontally at equal intervals in multi-tiers, and is longer than the width of the opening 10a. The upper nozzle 2 is formed with, at equal intervals, a plurality of supply holes 5 that supply a dry gas from a gas source 20 to be described below to a side opposite to the opening 10a of the substrate storage container 10 obliquely downwardly, for example, at a predetermined angle (θ) (15° in the present exemplary embodiment) with respect to the vertical direction. The supply holes 5 are formed in a region at least larger than the width of the opening 10a in order to supply the dry gas over the width of the opening 10a of the substrate storage container 10.

As illustrated in FIG. 2, for example, the side nozzles 3, 4 are disposed at left and right sides of the opening 10a of the substrate storage container 10, respectively, and are longer than the height of the opening 10a, that is the vertical length of the opening 10a. The side nozzles 3, 4 are formed with a plurality of supply holes 6 that supply the dry gas towards the inside of the substrate storage container 10 from the outside of the opening 10a.

As illustrated in FIGS. 2 and 3, each of the supply holes 6 is disposed at each of the heights located between wafers W stored in the substrate storage container 10. Here, the respective supply holes 6 formed on the side nozzle 3 and the respective supply holes 6 formed on the side nozzle 4 are formed alternately so as not to be located at the same height. The expression "formed alternately" indicates not only that the supply holes 6 are formed alternately one by one in the side nozzle 3 and the side nozzle 4, but also, for example, that a plurality of supply holes 6 are formed sequentially adjacent to each other in the vertical direction in any one of the side nozzles 3, 4, and a plurality of supply holes 6 are formed sequentially in the same manner at heights that are not overlapped with those of the supply holes of one nozzle in the other nozzle. Further, in the present exemplary embodiment, as illustrated in FIG. 2, in the side nozzle 3, at least two of the supply holes 6 are formed sequentially adjacent to each other in the vertical direction, and in the side nozzle 4, at least two of the supply holes 6 are formed sequentially in the same manner at heights that are not overlapped with those of the supply holes 6 formed in the side nozzle 3.

Further, as illustrated in FIGS. 2 and 3, both of the side nozzles 3, 4 are formed with defect portions 7 in which the supply holes are not formed. As the defect portions 7 are formed, regions G where the dry gas is not supplied are formed between the wafers W stored in the substrate storage container 10. Further, in order to facilitate understanding, FIG. 3 illustrates the supply holes 6 formed in the side nozzle 3 and the supply holes 6 formed in the side nozzle 4 to be overlapped in the side nozzle 4.

Further, for example, as illustrated in FIG. 4, the supply holes 6 are formed obliquely at a predetermined angle, when viewed from the top, so as to supply the dry gas along a diagonal line of the substrate storage container 10 from the opening 10a in a state where a cover 30 and a port door 40 are opened. The predetermined angle is, for example, 30° to 60°. In the present exemplary embodiment, the predetermined angle is set to, for example, 45°.

As illustrated in FIG. 1, the upper nozzle 2 is connected with the gas source 20 configured to supply, for example, dry nitrogen, through a gas supply pipe 21. The dry gas supplied from the gas supply pipe 21 to the upper nozzle 2 is also supplied to the side nozzles 3, 4 in communication with the upper nozzle 2. The gas supply pipe 21 is provided with a shutoff valve 22 configured to control supply and stop of the gas from the gas source 20. In the downstream of the shutoff valve 22 in the gas supply pipe 21, a flow meter 23 and a flow control mechanism 24 are provided and configured to control a flow rate of the dry gas from the gas source 20. In the present exemplary embodiment, the dry gas is supplied in, for example, 200 ml/min, and each of the supply holes 5, 6 is formed in such size that the dry gas flows to each of the upper nozzle 2 and the side nozzles 3, 4 in one third of the flow rate. Further, although the purging apparatus 1 of the present exemplary embodiment has an integral configuration in which the upper nozzle 2 and the side nozzles 3, 4 are in communication with each other, the purging apparatus 1 may have a configuration in which the upper nozzle 2 and the side nozzles 3, 4 are independent from each other. In such a case, each of the upper nozzle 2 and the side nozzles 3, 4 may be provided with a separate gas supply pipe 21. In this case, for example, the dry gas to each nozzle 2, 3, 4 may be independently controlled by branching the gas supply pipe 21 to three branches in the downstream of the shutoff valve 22, providing each shutoff valve to each branched gas supply pipe 21, and providing a flow meter 23 and a flow control mechanism 24 in the downstream of each shutoff valve.

The substrate storage container 10 as described above is provided with a cover 30 configured to seal the opening 10a. The bottom of the substrate storage container 10 is configured to be supported by a placing table 33 serving as a placing unit, which is provided outside a partition 32 forming a transfer chamber 31 of a wafer processing apparatus. The substrate storage container 10 is transferred from the outside of the wafer processing apparatus by a transfer mechanism (not illustrated), and placed on the top of the placing table 33. Further, a flow of the atmosphere flowing from the top to the bottom, that is, a downflow is formed in the transfer chamber 31.

The placing table 33 is supported by a support member 34 provided on an outer surface of the partition 32. The placing table 33 is configured to be movable horizontally on the support member 34 by a moving mechanism (not illustrated), so that the placing table 33 is movable frontward and rearward with respect to the partition 32 along with the substrate storage container 10.

A locking member 35 is provided in the rear side of the placing table 33, and thus, the placing table 33 and the substrate storage container 10 may be locked (clamped) at a predetermined position by the locking member 35.

The cover 30 is provided with a fitting member (not illustrated), and thus, the cover 30 and the substrate storage container 10 may be fitted (latched) by the fitting member. Further, a port door 40 is provided at a position facing the cover 30 in the partition 32. The port door 40 is configured to hold the cover 30 by moving the placing table 33 to abut (dock) the cover 30 with the port door 40. The port door 40 is configured to be freely opened or closed by a driving mechanism (not illustrated). Therefore, the cover 30 may be opened or closed by opening or closing the port door 40 in a state of abutting the port door 40 and the cover 30.

Each shutoff valve 22 or flow control mechanism 24 as described above is controlled by a control device 50. The control device 50 is configured by, for example, a computer including a CPU or a memory, and is able to perform the purge operation of the substrate storage container 10 by, for example, a program stored in the memory. Further, various programs for executing such an operation is stored in a storage medium H such as, for example, a hard disk (HD), a flexible disk (FD), a compact disk (CD), a magnet optical disk (MO), or a memory card, or installed from the storage medium H to the control device 50.

Figure 5:
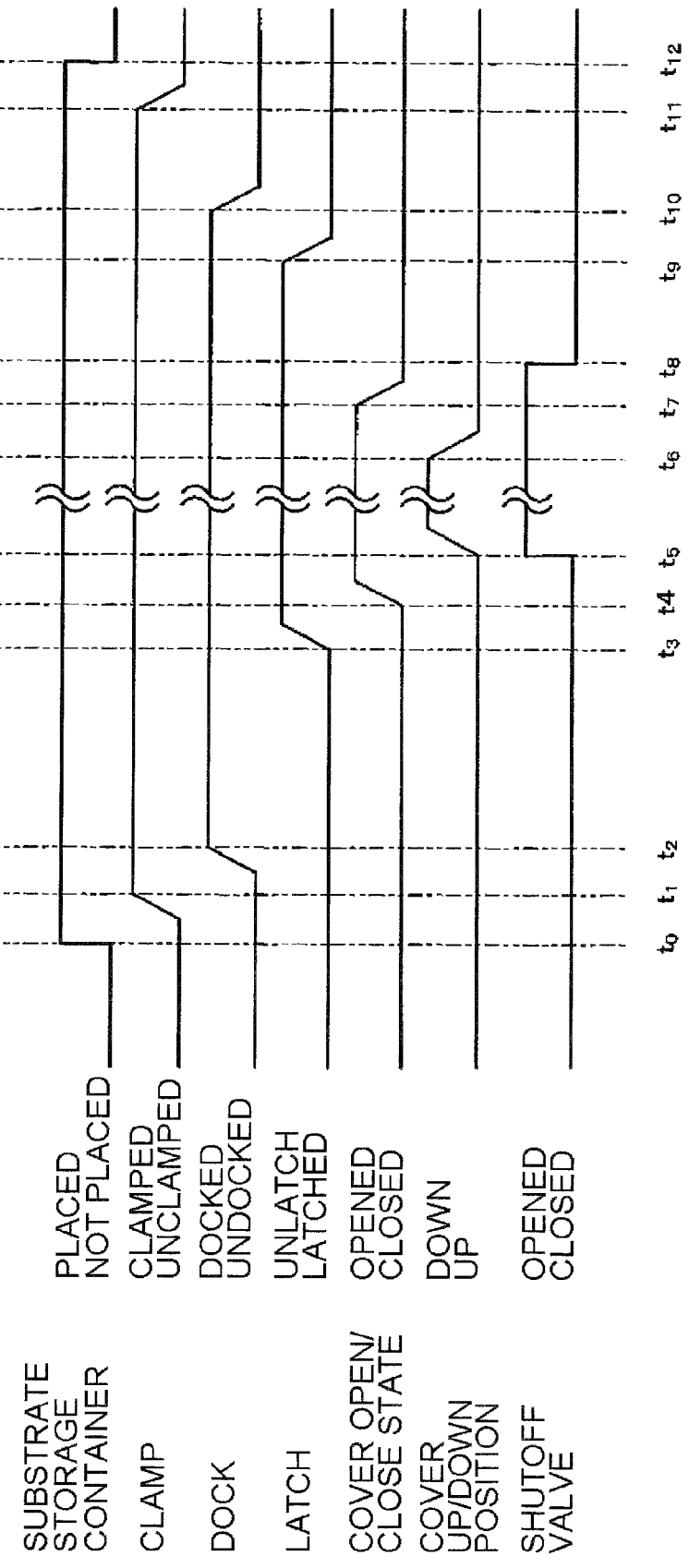
FIG. 5 is a time chart illustrating an example of a purging method according to the present exemplary embodiment.

The purging apparatus 1 according to the present exemplary embodiment is configured as described above. Next, a method of purging the substrate storage container 10 by the purging apparatus 1 will be described. FIG. 5 is a time chart illustrating an example of processes of the purging method, and the abscissa thereof denotes a time and the ordinate thereof denotes a state of each device.

In purging the substrate storage container 10, the substrate storage container 10 is first placed in the placing table 33 (time $t_0$ in FIG. 5). Then, the substrate storage container 10 is locked (clamped) to the placing table 33 by the locking member 35 (time $t_1$ in FIG. 5). Thereafter, the placing table 33 is moved to the partition 32 side to contact (dock) the cover 30 of the substrate storage container 10 and the port door 40 (time $t_2$ in FIG. 5).

Subsequently, a latch of the cover 30 is released (unlatched) (time $t_3$ in FIG. 5). Thereafter, the cover 30 is moved horizontally towards the transfer chamber 31 by a driving mechanism (not illustrated) to open the substrate storage container 10 (time $t_4$ in FIG. 5). The cover 30 moved horizontally is then moved below the opening 10a of the substrate storage container 10 (time $t_5$ in FIG. 5), and then, a transfer mechanism (not illustrated) provided in the transfer chamber 31 has access to each wafer W in the substrate storage container 10. Then, the cover 30 is opened, and the shutoff valve 22 is operated to be opened (time $t_5$ in FIG. 5), and the dry gas from the upper nozzle 2 of the purging apparatus 1 is supplied obliquely downwardly to a side opposite to the opening 10a to form an air curtain. Then, the air curtain may suppress the downflow in the transfer chamber 31 from flowing into the substrate storage container 10.

Further, by the opening operation of the shutoff valve 22, the dry gas from the side nozzles 3, 4 is supplied to the substrate storage container 10. At that time, as illustrated in FIG. 3, the dry gas supplied from the supply holes 6 formed alternately in the side nozzles 3, 4 reaches a rear side of the substrate storage container 10, that is, an end of the side opposite to the opening 10a, without staying while interfering with other dry gas supplied from other supply holes 6. That is, in a case where the supply holes 6 in the side nozzles 3, 4 are formed at the same height, it is considered that, the dry gases supplied from the respective supply holes 6 flow between the same wafers W and stay while interfering with each other. For this reason, it is considered that the flow of the dry gas is disturbed in the substrate storage container 10, and thus, the dry gas does not reach the rear end of the substrate storage container 10. However, by forming the supply holes 6 alternately in the side nozzles 3, 4 as in the present exemplary embodiment, such interference may be suppressed.

And, the dry gas that reaches the rear end of the substrate storage container 10 flows from regions corresponding to the defect portions 7 of the side nozzles 3, 4, which are positioned between wafers W, towards the opening 10a of the substrate storage container 10, and are discharged from the substrate storage container 10. As such, by forming the defect portions 7 in the side nozzles 3, 4, the dry gas supplied from the supply holes 6 of the side nozzles 3, 4 may be suppressed from staying while interfering with the dry gas flowing back from the rear end of the substrate storage container 10 towards the opening 10a. As a result, it is possible to efficiently substitute the atmosphere in the substrate storage container 10 with dry gas atmosphere and maintain the humidity in the substrate storage container 10 at a low level. Further, in a state where the cover 30 is opened, the humidity in the substrate storage container 10 is maintained at, for example, 35% or less. Further, the supplied flow rate of the dry gas may be determined based on a test which is performed in advance.

Thereafter, each wafer W is subjected to a plasma etching processing sequentially in a wafer processing apparatus, and when all the wafers W are processed and stored again in the substrate storage container 10, the cover 30 is first moved upwardly along with the port door 40 (time $t_6$ in FIG. 5). Subsequently, the cover 30 is moved up, and maintained in front of the opening 10a for a predetermined period of time in a state of maintaining the supply of the dry gas from the purging apparatus 1. As such, by positioning the cover 30 in front of the opening 10a, the supply of the dry gas from the opening 10a may be continued from the side nozzles 3, 4 while suppressing the atmosphere in the transfer chamber 31 from flowing into the substrate storage container 10 from the opening 10a. As a result, the humidity of the substrate storage container 10 may be further reduced as compared with a state where the cover 30 is moved below the opening 10a.

And, after a predetermined period of time, the cover 30 is moved horizontally towards the substrate storage container 10 (time $t_7$ in FIG. 5). Then, the shutoff valve 22 is closed, and the supply of the dry gas is stopped (time $t_8$ in FIG. 5).

Thereafter, the cover 30 is latched, and the substrate storage container 10 is sealed by the cover 30 (time $t_9$ in FIG. 5). When the substrate storage container 10 is sealed, the placing table 33 is moved to a side opposite to the partition 32 to perform separation (undocking) of the cover 30 of the substrate storage container 10 and the port door 40 (time $t_{10}$ in FIG. 5). Subsequently, the locking of the substrate storage container 10 and the placing table 33 is released (unclamped) (time $t_{11}$ in FIG. 5). Thereafter, the substrate storage container 10 is removed from the placing table 33 (time $t_{12}$ in FIG. 5), and transferred to another processing apparatus in which another processing is performed, and then, a series of purging operations are terminated.

According to the exemplary embodiment as described above, since the dry gas is supplied obliquely downwardly to a side opposite to the substrate storage container 10 and over the entire surface of the width of the opening 10a by the upper nozzle 2, a so-called air curtain may be formed on the front surface of the opening 10a of the substrate storage container 10. As a result, the atmosphere in the transfer chamber 31 is suppressed from flowing into the substrate storage container 10 from the opening 10a of the substrate storage container 10. Accordingly, the humidity in the substrate storage container 10 may be suppressed from being increased. In particular, in a case where an air curtain is formed vertically downwardly, the downflow formed in the transfer chamber 31 is caught in the air curtain, and thus, the atmosphere in the transfer chamber 31 flows in the bottom of the opening 10a of the substrate storage container 10. Therefore, by forming the air curtain at a predetermined angle as in the present exemplary embodiment, the downflow formed in the transfer chamber 31 may be effectively suppressed from flowing into the substrate storage container 10 from the opening 10a of the substrate storage container 10.

Further, since the supply holes 6 of the side nozzles 3, 4 are formed alternately so as not to be located at the same height, the dry gases supplied from both left and right side nozzles does not stay while interfering with each other in the substrate storage container 10. Therefore, the dry gas may be spread evenly everywhere inside the substrate storage container 10, and thus, the inside of the substrate storage container 10 may be maintained in a dry state. In particular, by forming, in both of the side nozzles 3, 4, the defect portions 7 in which the supply holes 6 are not formed, regions where the dry gas is not supplied directly from the supply holes 6 may be secured between the wafers W stored in the substrate storage container 10, and the dry gas supplied to the substrate storage container 10 may be discharged from the regions. Therefore, the atmosphere in the substrate storage container 10 may be efficiently substituted with a dry gas atmosphere. As a result, even though particles or gas which may cause unnecessary etching are released from the wafers W after a plasma etching is completed, $SiO_2$ or hydrofluoric acid is not produced. Therefore, the substrates in the substrate storage container 10 may be maintained in a good condition.

Further, in the above-mentioned exemplary embodiment, the purging apparatus 1 is provided separately from the substrate storage container 10. Therefore, even if the shape of the substrate storage container 10 is changed, the same purging apparatus 1 may be used. Specifically, for example, in a case where a connecting mechanism that penetrates the substrate storage container 10 and supplies a dry gas is provided, when the shape of the substrate storage container 10 is changed, the connection of the mechanism and the substrate storage container 10 may be dislocated. Thus, the purging apparatus 1 may not be used normally. In that case, since it is required to provide a dry gas supply mechanism in response to the substrate storage container 10 in each time, equipment cost is increased. In contrast, in the present exemplary embodiment, the purging apparatus 1 is provided outside the substrate storage container 10. Therefore, the purging apparatus 1 may be used regardless of the shape of the substrate storage container 10.

Figure 6:
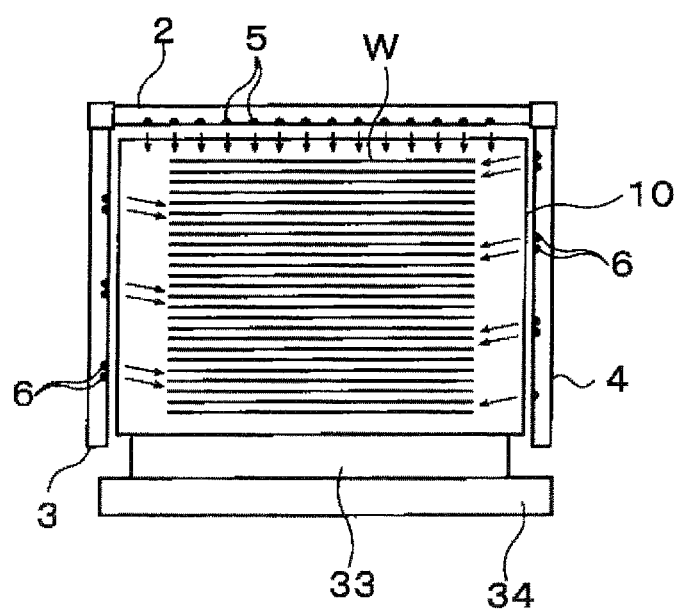
FIG. 6 is a front view illustrating a schematic configuration of the purging apparatus according to another exemplary embodiment and the vicinity of the substrate storage container.

In the above-mentioned exemplary embodiment, the supply holes 6 are formed at heights corresponding to the gaps between the wafers W in the substrate storage container 10 so that the dry gas is distributed and supplied between the wafers W. Therefore, even if the atmosphere in the transfer chamber 31 flows into the substrate storage container 10, the atmosphere on the surfaces of the wafers W may be substituted immediately with a dry gas atmosphere. Accordingly, the surfaces of the wafers W may be maintained under the dry gas atmosphere. Further, in the above-mentioned exemplary embodiment, the supply holes 6 are formed so as to supply the dry gas horizontally. However, the supply direction of the dry gas is not necessarily set to be horizontal. For example, as illustrated in FIG. 6, the dry gas may be supplied obliquely from above with respect to each gap between wafers W in the substrate storage container 10.

Further, in a case where the supply holes 6 are formed in the same size, it may be considered, for example, that the supply amount of the dry gas from the supply holes 6 near the upper nozzle 2 is increased, and the supply amount of the dry gas from the supply holes 6 far from the upper nozzle 2 is decreased. Therefore, the supply holes 6 do not necessarily have the same size. For example, the size of the supply holes 6 near the upper nozzle 2 may be smaller than that of the supply holes 6 far from the upper nozzle 2. Further, the supply holes 6 in the side nozzle 3 may have a difference size from those in the side nozzle 4. As long as the dry gas atmosphere is substituted evenly for the atmosphere in the substrate storage container 10, the shape or size thereof may be set arbitrarily.

In the above-mentioned exemplary embodiment, the supply of the dry gas is started after the cover 30 is moved down, but, the supply of the dry gas may be started before the cover 30 is moved down.

In the above-mentioned exemplary embodiment, the supply holes 5 of the upper nozzle 2 are formed so as to supply the dry gas obliquely downwardly at 15° to a side opposite to the opening 10a of the substrate storage container 10. However, the angle with respect to the opening 10a, that is, the angle with the vertical direction may be set arbitrarily in a range of 5° to 15°. According to the present inventors, if the angle is smaller than 5°, it is confirmed that the downflow in the transfer chamber 31 is caught in the dry gas formed by the upper nozzle 2 so that a sufficient function as an air curtain is not secured, and that the humidity in the substrate storage container 10 is not able to be maintained at 35% or less in a state where the cover 30 is opened. Further, if the angle is larger than 15°, it is also confirmed that the humidity in the substrate storage container 10 is not able to be maintained at 35% or less. When the angle is increased, it is considered that the downflow in the transfer chamber 31 penetrates the air curtain and flows into the substrate storage container 10.

From the foregoing, preferred embodiments of the present disclosure were described, but the present disclosure is not limited thereto. It will be appreciated by those skilled in the art that various modifications may be made within the scope of the spirit described in the following claims of the present disclosure. Accordingly, it is understood that their equivalents belong to the technical scope of the present disclosure.

DESCRIPTION OF SYMBOL

1: purging apparatus
2: upper nozzle
3, 4: side nozzle
5: supply hole
6: supply hole
7: defect portion
10: substrate storage container
20: gas source
21: gas supply pipe
22: shutoff valve
23: flow meter
24: flow control mechanism
30: cover
31: transfer chamber
32: partition
33: placing table
34: support member
35: locking member
40: port door
50: control device
W: wafer

What is claimed is:

1. A purging apparatus of purging an inside of a substrate storage container storing a plurality of substrates processed in a substrate processing apparatus vertically in multi-tiers from an outside of the substrate storage container, the purging apparatus comprising:

an upper nozzle provided above an opening that is provided at a side of the substrate storage container, and configured to supply a dry gas obliquely downwardly to a side opposite to the opening of the substrate storage container and over the entire surface of the width of the opening of the substrate storage container, while being configured not to supply the dry gas approximately downwardly and not to supply the dry gas obliquely downwardly to a side of the opening of the substrate storage container such that an atmosphere in a transfer chamber positioned next to the opening of the substrate storage container is suppressed from flowing into the substrate storage container through the opening of the substrate storage container, thereby suppressing a humidity in the substrate storage container from being increased; and a plurality of side nozzles provided at both left and right sides of the opening of the substrate storage container, respectively, and each configured to supply the dry gas towards the inside of the substrate storage container from an outside of the opening of the substrate storage container, wherein each of the side nozzles is longer than a height of the opening of the substrate storage container, and each of the side nozzles includes a plurality of supply holes formed thereon at predetermined intervals in a vertical direction, and the supply holes are configured to supply the dry gas towards the inside of the substrate storage container therethrough, and the respective supply holes on the side nozzle located at one side of the opening of the substrate storage container and the respective supply holes on the side nozzle located at the other side are disposed alternately in a vertical direction so as not to be located at the same height.

2. The purging apparatus of claim 1, wherein each of the supply holes of the side nozzles is positioned at a height between the substrates stored in the substrate storage container.

3. The purging apparatus of claim 2, wherein at least two of the supply holes are positioned sequentially adjacent to each other in the vertical direction of the side nozzles.

4. The purging apparatus of claim 1, wherein the plurality of side nozzles include defect portions in which the supply holes are not present such that the dry gas is not supplied between the substrates stored in the substrate storage container from any of the plurality of side nozzles.

5. The purging apparatus of claim 1, wherein the plurality of supply holes of each of the side nozzles are formed obliquely at a predetermined angle with respect to a virtual line orthogonal to each of the side nozzles when viewed from a top such that the dry gas is supplied along a diagonal line of the substrate storage container.

6. The purging apparatus of claim 5, wherein the predetermined angle ranges 30° to 60°.

7. The purging apparatus of claim 1, wherein the plurality of side nozzles supply the dry gas towards the substrate storage container in a parallel direction.

8. The purging apparatus of claim 1, wherein the upper nozzle supplies the dry gas obliquely downwardly at an angle of 5° to 15° with respect to the vertical direction.

9. A purging method of purging an inside of a substrate storage container storing a plurality of substrates processed in a substrate processing apparatus vertically in multi-tiers from the outside of the substrate storage container by a purging apparatus, the method comprising:
providing the purging apparatus including:
an upper nozzle provided above an opening that is provided at a side of the substrate storage container; and
a plurality of side nozzles provided at both left and right sides of the opening of the substrate storage container, respectively,
wherein each of the side nozzles is longer than a height of the opening of the substrate storage container, and each of the side nozzles includes a plurality of supply holes thereon at predetermined intervals in a vertical direction, and the supply holes are configured to supply the dry gas towards the inside of the substrate storage container therethrough, and
the respective supply holes on the side nozzle located at one side of the opening of the substrate storage container and the respective supply holes on the side nozzle located at the other side are disposed alternately so as not to be located at the same height,
placing the substrate storage container on a placing unit;
after a cover of the substrate storage container is opened,
supplying, by the upper nozzle, a dry gas obliquely downwardly to a side opposite to the opening of the substrate storage container and over the entire surface of the width of the opening of the substrate storage container, while not supplying the dry gas approximately downwardly and not supplying the dry gas obliquely downwardly to a side of the opening of the substrate container such that an atmosphere in a transfer chamber positioned next to the opening of the substrate storage container is suppressed from flowing into the substrate storage container through the opening of the substrate storage container, thereby suppressing a humidity in the substrate storage container from being increased;
supplying, by the each of the plurality of side nozzles, the dry gas towards the inside of the substrate storage container from an outside of the opening of the substrate storage container;
closing the cover of the substrate storage container after a processing of the substrates in the substrate storage container is terminated; and
stopping supplying the dry gas after a door of the substrate storage container is closed.

* * * * *